(12) United States Patent
Shimizu et al.

(10) Patent No.: US 9,287,311 B2
(45) Date of Patent: Mar. 15, 2016

(54) SEMICONDUCTOR DEVICE AND SEMICONDUCTOR-DEVICE MANUFACTURING METHOD

(75) Inventors: Kan Shimizu, Kumamoto (JP); Keishi Inoue, Kunamoto (JP)

(73) Assignee: SONY CORPORATION, Tokyo (JP)

( * ) Notice: Subject to any disclaimer, the term of this patent is extended or adjusted under 35 U.S.C. 154(b) by 33 days.

(21) Appl. No.: 13/587,317

(22) Filed: Aug. 16, 2012

(65) Prior Publication Data

US 2013/0082341 A1 Apr. 4, 2013

(30) Foreign Application Priority Data

Sep. 30, 2011 (JP) ................... 2011-216930

(51) Int. Cl.
| | | |
|---|---|---|
| *H01L 27/14* | (2006.01) | |
| *H01L 27/146* | (2006.01) | |
| *H01L 23/48* | (2006.01) | |
| *H01L 21/44* | (2006.01) | |

(52) U.S. Cl.
CPC ... *H01L 27/14636* (2013.01); *H01L 2224/9202* (2013.01); *H01L 2224/94* (2013.01); *H01L 2924/13091* (2013.01)

(58) Field of Classification Search
CPC .................. H01L 27/14636; H01L 23/481
USPC ........... 257/774, E23.011, E23.145, E23.152, 257/771; 438/57; 250/208.1; 348/294
See application file for complete search history.

(56) References Cited

U.S. PATENT DOCUMENTS

| | | |
|---|---|---|
| 5,262,354 A | 11/1993 | Cote et al. |
| 5,498,768 A * | 3/1996 | Nishitani et al. ............. 438/644 |
| 6,030,895 A | 2/2000 | Joshi et al. |
| 6,285,082 B1 | 9/2001 | Joshi et al. |
| 6,335,569 B1 | 1/2002 | Joshi |

(Continued)

FOREIGN PATENT DOCUMENTS

| | | |
|---|---|---|
| EP | 0 558 004 A2 | 9/1993 |
| EP | 2 230 691 A2 | 9/2010 |

(Continued)

OTHER PUBLICATIONS

Extended European Search Report issued Jul. 22, 2013 in Patent Application No. 12184812.1.

(Continued)

*Primary Examiner* — Julio J Maldonado
*Assistant Examiner* — Moazzam Hossain
(74) *Attorney, Agent, or Firm* — Oblon, McClelland, Maier & Neustadt, L.L.P.

(57) ABSTRACT

It is possible to reduce resistance variations of a member connecting a through-silicon via to a line and improve wiring reliability. A hole through which the through-silicon via is to be stretched is created and an over-etching process is carried out on a wiring layer including the line. Then, by embedding copper in the hole, the through-silicon via made of the copper can be created. After the through-silicon via has been connected to the line made of aluminum through the member which is a connection area, the connection area is alloyed in a thermal treatment in order to electrically connect the through-silicon via to the line. Thus, it is possible to reduce variations of a resistance between the through-silicon via and the line and also improve wiring reliability as well. The present technology can be applied to a semiconductor device and a method for manufacturing the semiconductor device.

13 Claims, 7 Drawing Sheets

(56) References Cited

U.S. PATENT DOCUMENTS

| | | | |
|---|---|---|---|
| 7,115,196 B2* | 10/2006 | Chen et al. ...................... 205/82 |
| 2002/0096768 A1 | 7/2002 | Joshi |
| 2002/0130415 A1* | 9/2002 | Hasunuma ........ H01L 21/32051 257/751 |
| 2004/0031693 A1* | 2/2004 | Chen et al. .................... 205/123 |
| 2004/0173905 A1* | 9/2004 | Kamoshima et al. ......... 257/758 |
| 2008/0081532 A1* | 4/2008 | Okuno ............................ 445/24 |
| 2008/0237863 A1* | 10/2008 | Toyoda et al. ................ 257/751 |
| 2010/0238331 A1 | 9/2010 | Umebayashi et al. |
| 2011/0102657 A1* | 5/2011 | Takahashi et al. ............ 348/308 |
| 2011/0233702 A1 | 9/2011 | Takahashi et al. |
| 2012/0086094 A1 | 4/2012 | Watanabe |

FOREIGN PATENT DOCUMENTS

| | | |
|---|---|---|
| JP | 2001-93976 | 4/2001 |
| JP | 2010-245506 | 10/2010 |
| JP | 2011-138841 | 7/2011 |
| JP | 2012-84693 | 4/2012 |

OTHER PUBLICATIONS

Office Action issued Jul. 16, 2015 in Japanese Patent Application No. 2011-216930.

* cited by examiner

SEMICONDUCTOR DEVICE AND SEMICONDUCTOR-DEVICE MANUFACTURING METHOD

BACKGROUND

In general, the present technology relates to a semiconductor device and a method for manufacturing the semiconductor device. More particularly, the present technology relates to a semiconductor device having reduced resistance variations and improved wiring reliability and relates to a method for manufacturing the semiconductor device.

In recent years, the market of small-size camera modules applied to digital still cameras and smart phones draws attention. A CCD (Charge Couple Device) and a CMOS (Complementary Metal Oxide Semiconductor) image sensor are typical solid-state imaging devices used in the camera modules. In the case of such a solid-state imaging device, accompanying miniaturizations in the semiconductor technology, it has become possible to improve the performance of the image sensor, contract the footprint and enhance the integration. In addition, as one technology for further improving the performance of the image sensor, further contracting the footprint and further enhancing the integration, there has been provided a technology for manufacturing three-dimensional semiconductor integrated circuits. A typical example of this technology has been reported in Japanese Patent Laid-open No. 2010-245506 as a technology for manufacturing a semiconductor device configuring a solid-state image pickup device of the rear-surface radiation type. In accordance with this technology, first of all, semiconductor elements having different functions are joined to each other. In this case, the semiconductor elements having different functions are a semiconductor element having a pixel array and a semiconductor element having a logic circuit. Then, the pixel array and the logic circuit are connected electrically to each other by making use of TSV (Through-Silicon Via) configured to penetrate a silicon substrate.

SUMMARY

By the way, in a process to construct a semiconductor device making use of through-silicon vias, without regard to whether the device has the rear-surface radiation type or the front-surface radiation type, the semiconductor element having a pixel array is electrically connected to the semiconductor element having a logic circuit. Thus, it is necessary that the through-silicon via assure low resistances and high wiring reliability. In addition, in the case of the through-silicon vias, in particular, in order to electrically connect the semiconductor element having a pixel array to the semiconductor element having a logic circuit with a high degree of certainty, the through-silicon vias must be created to penetrate not only the silicon substrate, but also the junction plane, and reach the deeply inner portions of the semiconductor elements.

However, the technology used for creating a TSV reaching the deeply inner portions of the semiconductor elements is limited due to the fact that the limit of an etching quantity is determined by conditions such as the diameter of the through-silicon via, the depth of the through-silicon via, the layout of through-silicon vias and the productivity. Thus, if the interlayer film is thick, it is feared that the through-silicon via does not reach the deeply inner portions of the semiconductor elements. In addition, if the etching rate is increased, the controllability of the depth of the through-silicon via becomes poor. In the case of a through-silicon via having the highest etching rate, that is, in the case of a through-silicon via having a large diameter or in the case of a shallow through-silicon via, the etching process is carried out excessively so that it is quite within the bounds of possibility that not only does a line directly beneath the through-silicon via retrogress, but the wiring material surface also gets oxidized. As a result, it is feared that the resistance variations increase and the wiring reliability deteriorates.

In order to solve the problems described above, in general, there was adopted a method for creating an etching stopper layer for the line directly beneath the through-silicon via. The etching stopper layer is a barrier metal film such a TaN (tantalum nitride) film or a TiN (titan nitride) film. For a through-silicon via having a diameter and/or a depth in a range of several microns to more than ten microns, however, if a barrier metal film having a thickness in a range of several nanometers to more than a hundred nanometers is created, from the etching-controllability point of view and the etching-productivity point of view, it is difficult to create a sufficiently effective etching stopper layer.

The present technology has been made in view of the circumstances described above, and to reduce resistance variations and improve wiring reliability by particularly alloying a contact area between a through-silicon via and a line.

A semiconductor device according to an embodiment of the present technology has a contact area alloyed in order to connect an electrode to a line in the semiconductor device. It is possible to provide the semiconductor device with a configuration wherein the electrode and the line share the contact area alloyed in order to electrically connect the electrode and the line to each other in a second semiconductor wafer, which includes logic circuits and lines, and a first semiconductor wafer which includes photoelectric conversion sections and lines.

It is possible to provide the semiconductor device with a configuration wherein the electrode is a through-silicon via penetrating the first semiconductor wafer stuck to the second semiconductor wafer and the contact area is alloyed in order to electrically connect the through-silicon via and the line to each other in the second semiconductor wafer.

It is possible to provide the semiconductor device with a configuration wherein, in a process of sticking the first semiconductor wafer to the second semiconductor wafer and forming a barrier metal film on a penetration hole through which the through-silicon via penetrates the first semiconductor wafer, an aluminum-oxide film on the surface of the line made of aluminum in the second semiconductor wafer is removed and the contact area is alloyed in order to electrically connect the through-silicon via made of copper to the line made of aluminum.

It is possible to provide the semiconductor device with a configuration wherein the contact area is alloyed by carrying out a thermal treatment in order to electrically connect the through-silicon via made of copper to the line made of aluminum.

It is possible to provide a rear-surface radiation solid-state imaging device provided by the present technology with a configuration wherein the rear-surface radiation solid-state imaging device includes the semiconductor device in which: a contact area is alloyed in order to connect an electrode to a line; and the electrode and the line share the contact area alloyed in order to electrically connect the electrode and the line to each other in a second semiconductor wafer, which includes logic circuits and lines, and a first semiconductor wafer which includes photoelectric conversion sections and lines.

A semiconductor-device manufacturing method according to the embodiment of the present technology includes a process of alloying a contact area in order to connect an electrode to a line in the semiconductor device. It is possible to configure the semiconductor-device manufacturing method so that, in the process, the contact area shared by the electrode and the line is alloyed in order to electrically connect the electrode and the line to each other in a second semiconductor wafer, which includes logic circuits and lines, and a first semiconductor wafer which includes photoelectric conversion sections and lines.

It is possible to configure the semiconductor-device manufacturing method so that, in the process, the electrode is created to serve as a through-silicon via penetrating the first semiconductor wafer stuck to the second semiconductor wafer and the contact area is alloyed in order to electrically connect the through-silicon via and the line to each other in the second semiconductor wafer.

It is possible to configure the semiconductor-device manufacturing method so that, the process includes a first process of sticking the first semiconductor wafer to the second semiconductor wafer, and a second process of forming a barrier metal film on a penetration hole through which the through-silicon via penetrates the first semiconductor wafer. In the second process, an aluminum-oxide film on the surface of the line made of aluminum in the second semiconductor wafer is removed; and in the second process, the contact area is alloyed in order to electrically connect the through-silicon via made of copper to the line made of aluminum.

It is possible to configure the semiconductor-device manufacturing method so that the contact area is alloyed by carrying out a thermal treatment in order to electrically connect the through-silicon via made of copper to the line made of aluminum.

It is possible to configure a method for manufacturing a rear-surface radiation solid-state imaging device provided by the present technology so that the method includes a semiconductor-device manufacturing method including a process of alloying a contact area in order to connect an electrode to a line in a semiconductor device whereby, in the process, the contact area shared by the electrode and the line is alloyed in order to electrically connect the electrode and the line to each other in a second semiconductor wafer, which includes logic circuits and lines, and a first semiconductor wafer which includes photoelectric conversion sections and lines.

In accordance with the embodiment of the present technology, a semiconductor device has a contact area alloyed in order to connect an electrode to a line in the semiconductor device. The electrode and the line share the contact area alloyed in order to electrically connect the electrode and the line to each other in a second semiconductor wafer, which includes logic circuits and lines, and a first semiconductor wafer which includes photoelectric conversion sections and lines.

In accordance with the present technology, it is possible to reduce resistance variations in a semiconductor device provided by the present technology and improve wiring reliability of the semiconductor device.

DETAILED DESCRIPTION OF THE PREFERRED EMBODIMENTS

[Typical Configuration of the Existing Semiconductor Device]

Before a semiconductor device according to the present technology is explained, the following description explains an existing semiconductor device and a method for manufacturing the existing semiconductor device by taking an existing semiconductor device employed in a solid-state imaging device of the rear-surface radiation type as an example.

Figure 1:
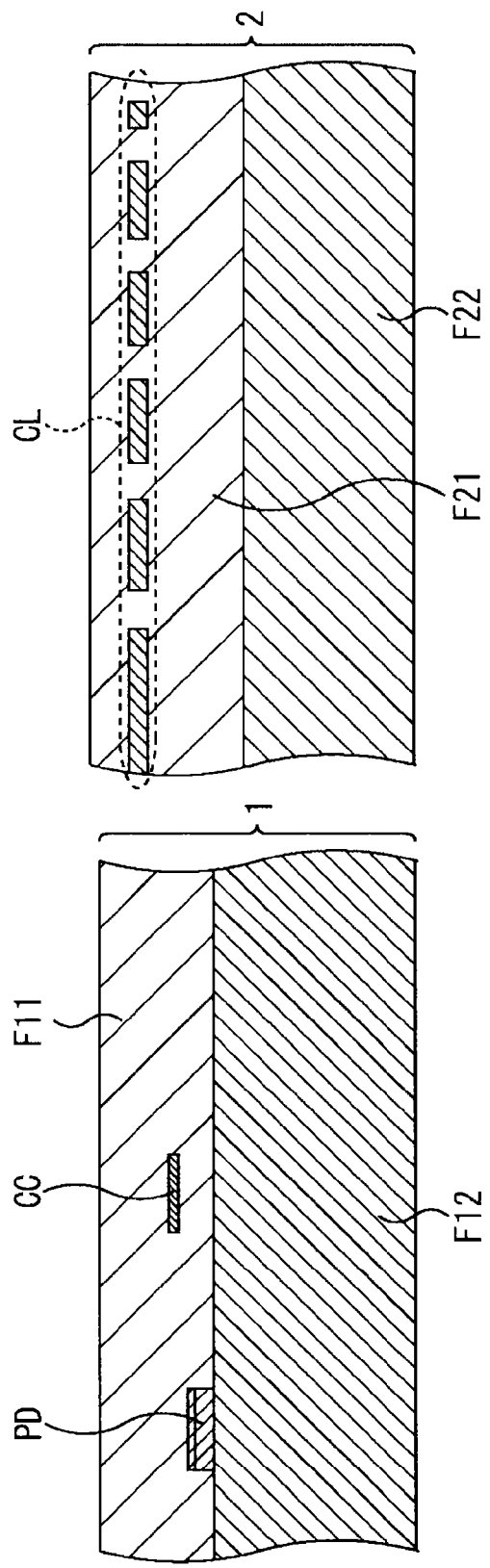
FIGS. 1A and 1B are diagrams showing typical configurations of two semiconductor wafers used in a process of manufacturing an existing manufacturing device.

First of all, in a first process, a first semiconductor wafer 1 having a pixel array as shown in FIG. 1A and a second semiconductor wafer 2 having a logic circuit as shown in FIG. 1B are created. In the following description, the first semiconductor wafer 1 is also referred to as a CIS substrate 1 whereas the second semiconductor wafer 2 is also referred to as a logic substrate 2.

As shown in FIG. 1A, the CIS substrate 1 is configured to include a silicon substrate F12 and an inter-layer film F11 on the silicon substrate F12. For every pixel in the inter-layer film F11, the inter-layer film F11 also includes a photodiode PD, a line CC, a pixel transistor and a transfer transistor. The photodiode PD is a photoelectric conversion element. The pixel transistor and the transfer transistor are not shown in the figure. Each of the pixel transistor and the transfer transistor includes a source area, a drain area and multi-layer lines surrounding the areas.

As shown in FIG. 1B, on the other hand, the logic substrate 2 is configured to include a silicon substrate F22 and an inter-layer film F21 on the silicon substrate F22. The logic substrate 2 also includes a plurality of MOS transistors not shown in the figure. Each of the MOS transistors has an element separation area, a source area and a drain area. In addition, the logic substrate 2 also includes a logic circuit for processing signals and multi-layer lines CL.

It is to be noted that the line CC of the CIS substrate 1 is made of Cu (copper) whereas the line CL of the logic substrate 2 is made of Al (aluminum).

Figure 2:
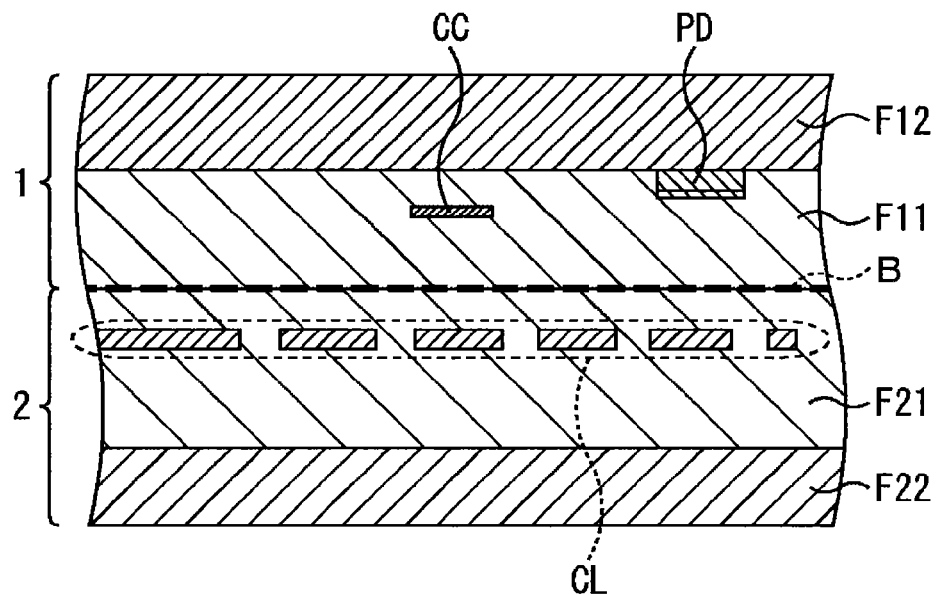
FIG. 2 is a diagram showing a configuration in which the two semiconductor wafers shown in FIGS. 1A and 1B are stuck to each other.

In a second process, as shown in FIG. 2, the surface of the inter-layer film F11 employed in the CIS substrate 1 and the surface of the inter-layer film F21 employed in the logic substrate 2 are flattened by carrying out CMP (Chemical Mechanical Polishing) and, then, stuck to each other in order to join the surface of the inter-layer film F11 to the surface of the inter-layer film F21. Subsequently, the side of the CIS substrate 1 is ground to form a thin film. In FIG. 2, the CIS substrate 1 shown in FIG. 1A is put in a state of being inverted upside down and stuck to the surface of the inter-layer film F21 employed in the logic substrate 2 by mounting the CIS substrate 1 on the surface to form a junction plane B.

Figure 3:
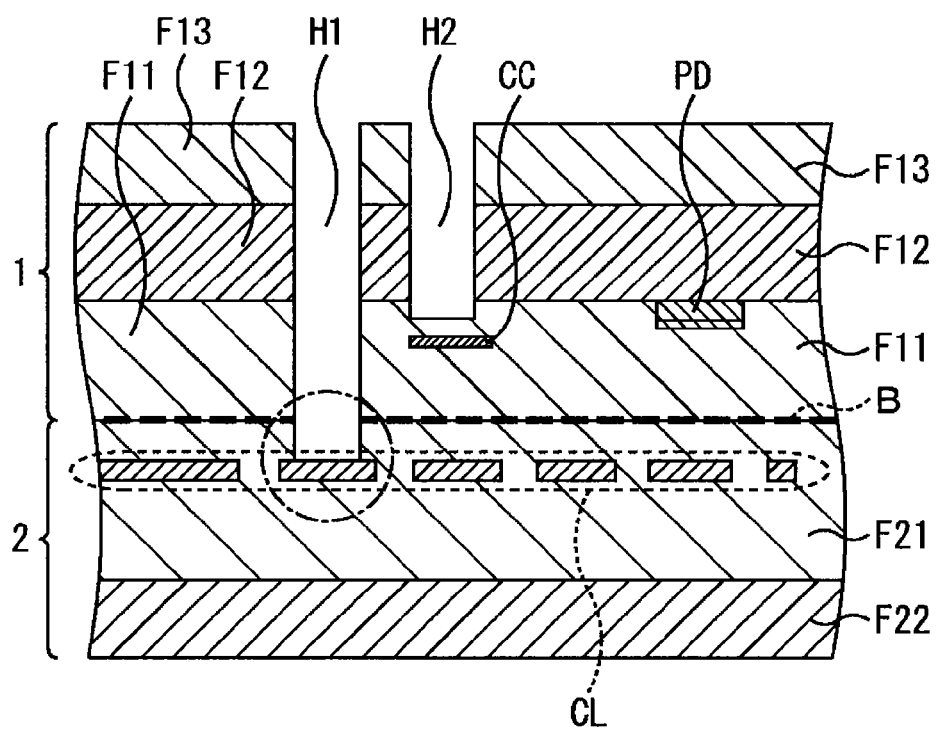
FIG. 3 is a diagram to be referred to in description of a process of creating a hole for a through-silicon via.

In a third process, in order to create a through-silicon via, an inter-layer film F13 is created on the side of the CIS substrate 1 as shown in FIG. 3. Then, in order to make a connection to a line CL in the logic substrate 2, a hole H1 for a through-silicon via is made to penetrate the junction plane B. By the same token, in order to make a connection to a line CC of the CIS substrate 1, a hole H2 for another through-silicon via is made. The hole H1 is made to reach the line CL or reach a position in front of the line CL. By the same token, the hole H2 is made to reach the line CC or reach a position in front of the line CC. In addition, on the inner wall of each of the holes H1 and H2, an insulation film is formed to serve as an insulator against the CIS substrate 1.

In the process described above, the diameter of each of the holes H1 and H2 is set at a value in a range of typically 1 to 5 microns. On the other hand, the depth of each of the holes H1 and H2 is set at a value in a range of typically 3 to 15 microns. In addition, the width of the line CL directly beneath the bottom of the hole H1 is set at a value not smaller than 1 micron. By the same token, the width of the line CC directly beneath the bottom of the hole H2 is set at a value not smaller than 1 micron. On the other hand, the thickness of each of the lines CL and CC is set at a value in a range of 100 nanometers to 1 micron.

Figure 4:
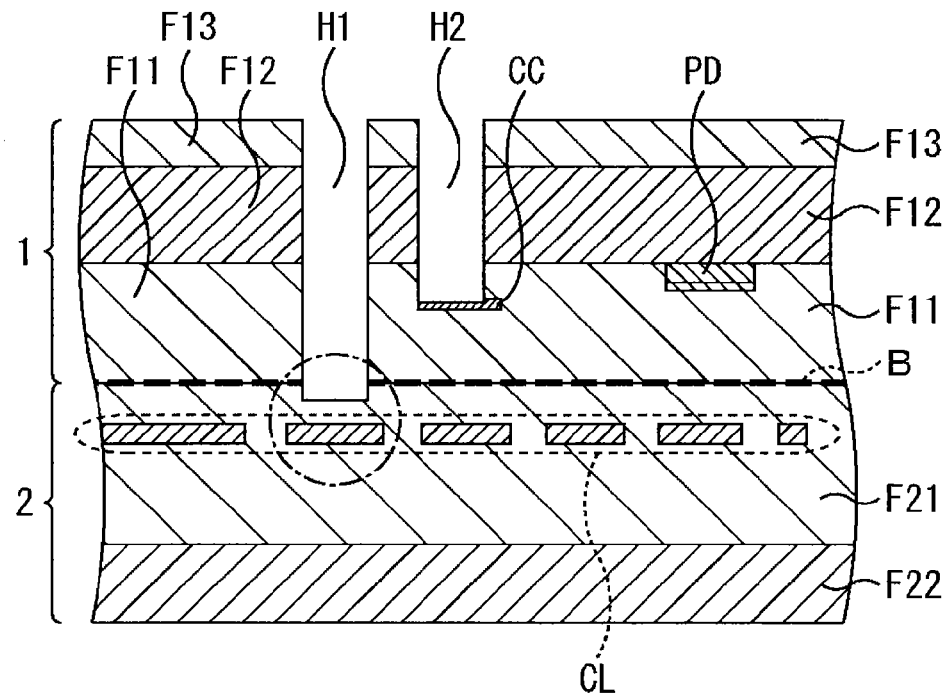
FIG. 4 is a diagram showing a case in which bad contact is generated due to under-etching.

In a fourth process, the oxidized film of the bottom of the hole H1 is removed by etching. By the same token, the oxidized film of the bottom of the hole H2 is removed by etching. By the way, it is particularly difficult to control the depth of the hole H1 which is the deeper one of the holes H1 and H2. Thus, variations of the oxidized film at the bottom of the hole H1 increase with ease. For this reason, as indicated by a member enclosed by a dotted line as shown in FIG. 3, it is ideally desirable that the hole H1 has such a depth that the bottom of the hole H1 reaches the line CL. In actuality, however, the bottom of the hole H1 is shifted from the line CL. That is to say, in actuality, as indicated by a member enclosed by a dotted line as shown in FIG. 4, for example, the hole H1 has such a depth that the bottom of the hole H1 does not reach the line CL. The state in which the bottom of the hole H1 does not reach the line CL is a state of the so-called under-etching. In this case, it is feared that the connection is bad or, to be more specific, the connection is open.

Figure 5:
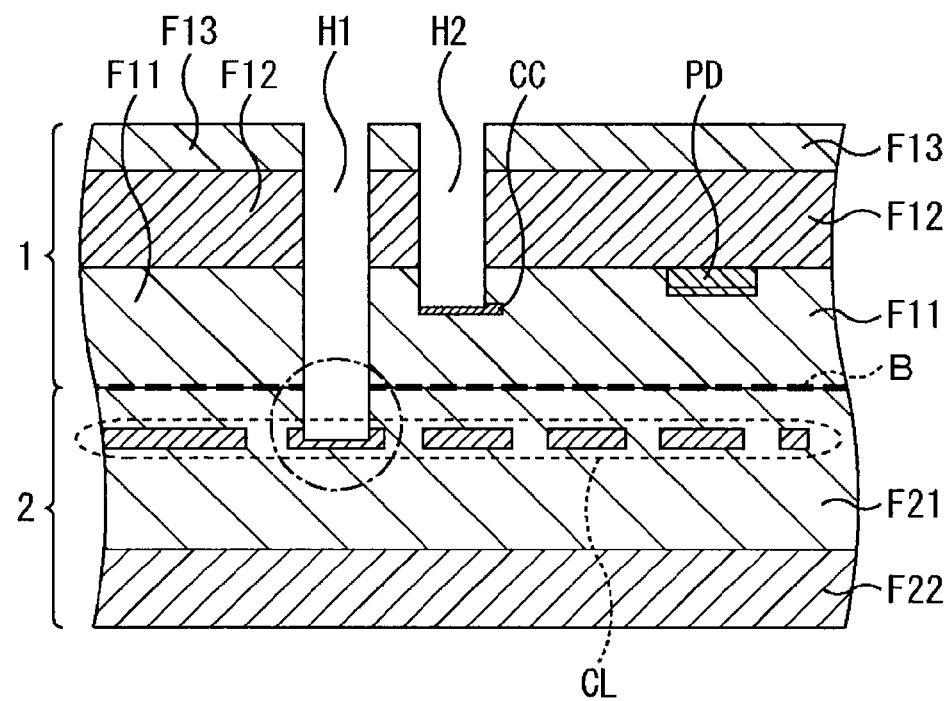
FIG. 5 is a diagram to be referred to in description of line retrogression and line oxidation which are caused by over-etching.

In order to solve this problem, it is necessary to apply excessive over-etching. In this case, however, as indicated by a member enclosed by a dotted line as shown in FIG. 5, it is feared that a film remaining on the line CL becomes thin, a layer damaged by the over-etching is created on the surface of the line CL or an oxidized layer is created on the surface of the line CL.

Figure 6:
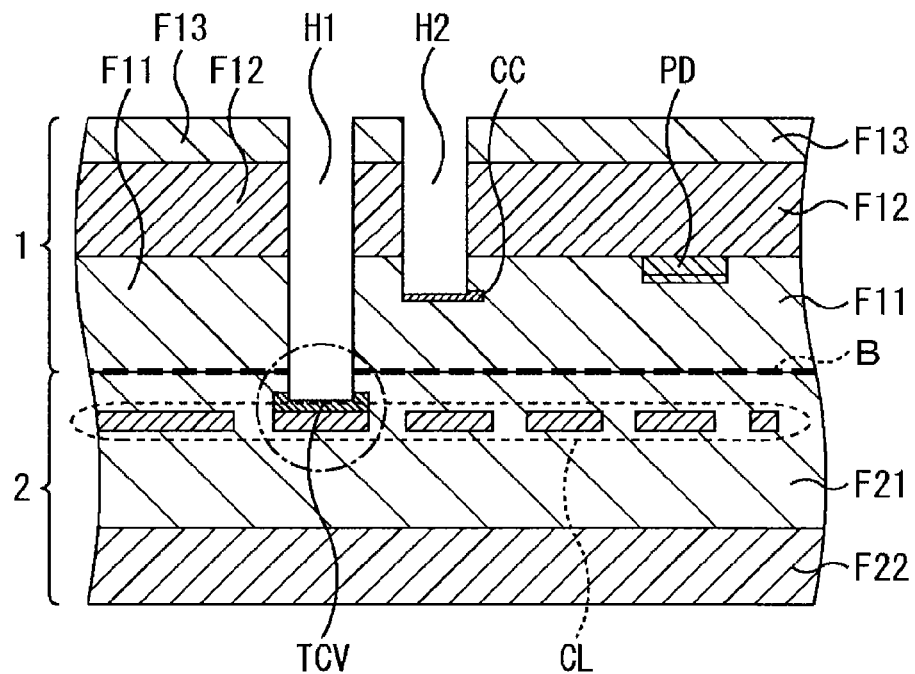
FIG. 6 is a diagram to be referred to in description of controllability difficulties encountered when making use of an etching stopper.

In order to solve the problems caused by the over-etching as described above, as indicated by a member enclosed by a dotted line as shown in FIG. 6, an etching stopper layer TCV may be created on the line CL in order to increase the film remaining on the line CL. In the case of a hole H1 provided for the through-silicon via to serve as a hole having a diameter and/or a depth in a range of several microns to more than ten microns, however, if a generally used barrier metal film having a thickness in a range of several nanometers to more than a hundred nanometers is to be created, from the etching-controllability point of view and the etching-productivity point of view, it is difficult to create a sufficiently effective etching stopper layer TCV. If a sufficiently thick etching stopper layer TCV having a thickness of about several hundreds of nanometers is created, on the other hand, it is feared that the resistance of contact between the through-silicon via created from copper filling up the hole H1 and the line CL increases.

Figures 7A, 7B, 7C:
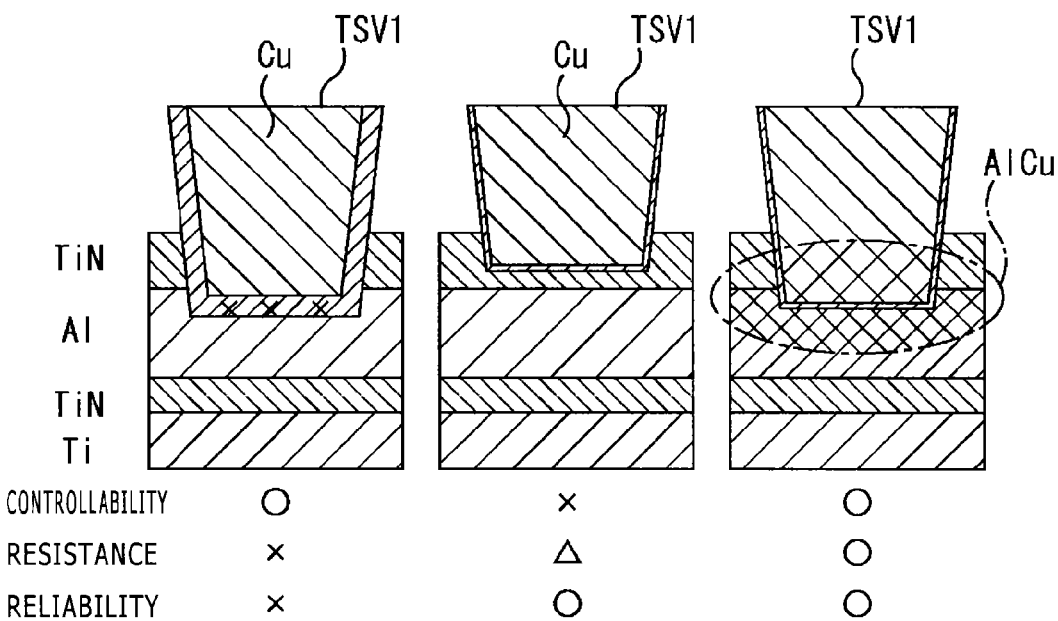
FIGS. 7A to 7C are explanatory diagrams showing different states of a contact area between a penetrating electrode and a line.

FIGS. 7A to 7C are explanatory diagrams showing structures of a through-silicon via TSV1 created by carrying out the under-etching and over-etching processes like the ones described above. That is to say, if the through-silicon via TSV1 made of copper is created by carrying out the over-etching process, as shown in FIG. 7A, the through-silicon via TSV1 has a structure reaching an aluminum layer from a nitride-titan (TiN) layer forming the surface of the line. Thus, the through-silicon via TSV1 can be created with ease from the control point of view. As indicated by cross marks shown in FIG. 7A, however, the boundary surface between the aluminum layer and the through-silicon via TSV1 is oxidized during the process of creating the through-silicon via TSV1, so that the contact resistance increases. Thus, the reliability of the line deteriorates. It is to be noted that, in this case, the reliability of the line indicates the degree of EM (Electronic Migration) tolerability for the line and the degree of SM (Stress Migration) tolerability for the line.

If the through-silicon via TSV1 is created by carrying out the under-etching process, on the other hand, as shown in FIG. 7B, the control of the depth of the through-silicon via TSV1 is difficult because it is necessary to take depth variations of the through-silicon via TSV1 into consideration. In addition, it is feared that the resistance of contact between the through-silicon via TSV1 made of copper and the line made of aluminum increases because a nitride-titan (TiN) layer is included at a location between the through-silicon via TSV1 and the line. It is to be noted that if the depth of the through-silicon via TSV1 can be controlled with a high degree of accuracy, high reliability can be obtained even though the implementation is very difficult.

[Configuration of the Semiconductor Device According to the Present Technology]

As described above, for the connection between the through-silicon via made of copper and the line made of aluminum to serve respectively as a through-silicon via and a line which form the semiconductor device, it is ideal that the depth of the hole for the through-silicon via is relatively easy to control, the resistance of the connection member is low and the reliability of the line is high.

For the reason described above, in the semiconductor device according to the present technology, a contact area is alloyed in order to implement the ideal configuration explained above. The contact area is an area in which the through-silicon via made of copper is brought into contact with the line made of aluminum.

[Process of Manufacturing the Semiconductor Device According to the Technology]

Figure 8:
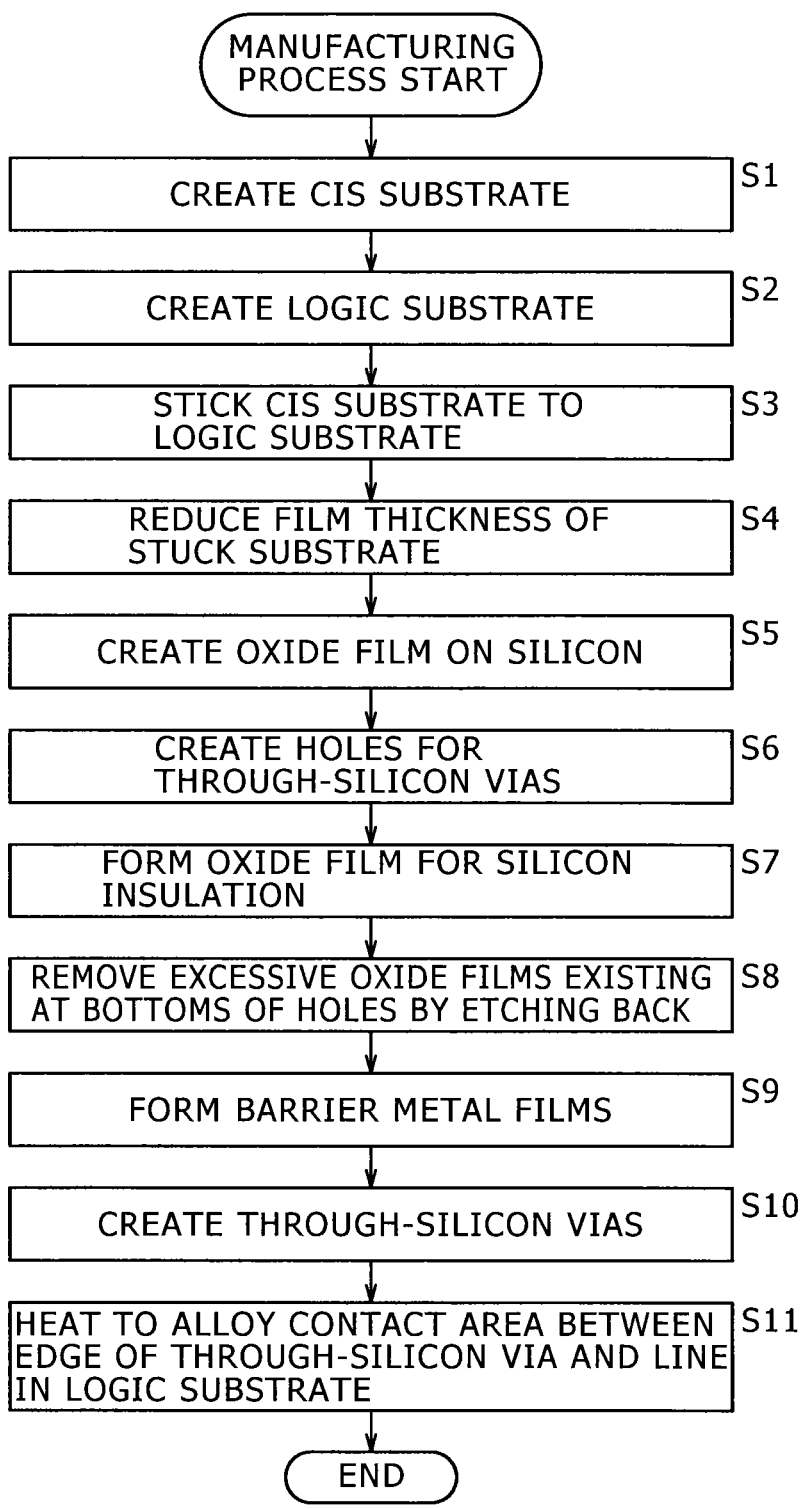
FIG. 8 is an explanatory flowchart representing processing to manufacture a semiconductor device according to the present technology.

By referring to a flowchart shown in FIG. 8, the following description explains a process of manufacturing a semiconductor device provided by the present technology to serve as a solid-state imaging device of the rear-surface radiation type.

That is to say, the following description explains a method for manufacturing such a semiconductor device. In addition, the configuration of the semiconductor device is also described. It is to be noted that, in the explanation of the process of manufacturing the semiconductor device with reference to the flowchart shown in FIG. 8, FIGS. 9 to 12 are also referred to as well. In FIGS. 9 to 12, every configuration identical with its counterpart configuration shown in FIGS. 1A to 6 is given the same name or denoted by the same reference numeral as the counterpart and the explanation of the identical configuration is properly omitted from the following description.

As shown in the figure, the flowchart begins with a step S1 at which the first semiconductor wafer 1 having an array of pixels is created as shown in FIG. 1A. In the following description, the first semiconductor wafer 1 is also referred to as the CIS substrate 1.

Then, at the next step S2, the second semiconductor wafer 2 having a logic circuit is created as shown in FIG. 1B. In the following description, the second semiconductor wafer 2 is also referred to as the logic substrate 2.

Subsequently, at the next step S3, as shown in FIG. 2, the surface of the inter-layer film F11 employed in the CIS substrate 1 and the surface of the inter-layer film F21 employed in the logic substrate 2 are flattened by carrying out a CMP (Chemical Mechanical Polishing) process and, then, stuck to each other in order to join the surface of the inter-layer film F11 to the surface of the inter-layer film F21.

Then, at the next step S4, the side of the CIS substrate 1 is ground to form a thin film as a whole.

Subsequently, at the next step S5, in order to create a through-silicon via, an inter-layer film F13 is created on the side of the CIS substrate 1 as shown in FIG. 3.

Figure 9:
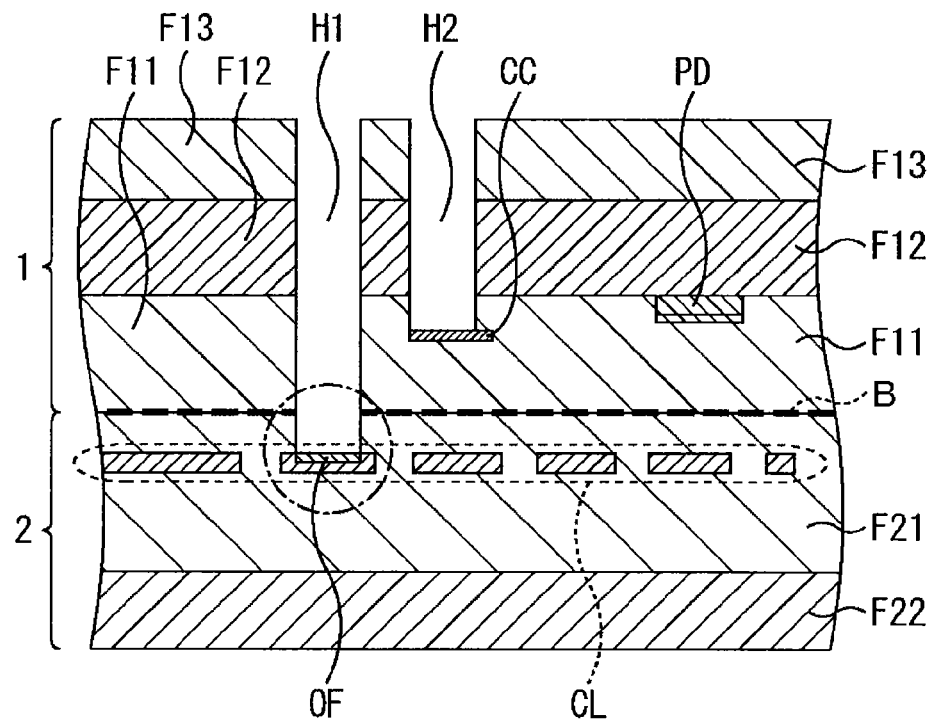
FIG. 9 is an explanatory diagram to be referred to in description of a process of creating a hole for a through-silicon via in accordance with the present technology.

Then, at the next step S6, in order to make a connection to a line CL of the logic substrate 2, a hole H1 for a through-silicon via is made to penetrate the silicon substrate F12 and the junction plane B as shown in FIG. 9. By the same token, in order to make a connection to a line CC of the CIS substrate 1, a hole H2 for another through-silicon via is made to penetrate the silicon substrate F12 as shown in FIG. 9. The hole H1 is made to reach the line CL or reach a position in front of the line CL. By the same token, the hole H2 is made to reach the line CC or reach a position in front of the line CC.

Subsequently, at the next step S7, on the inner wall of each of the holes H1 and H2 shown in FIG. 9, an insulation film is formed to serve as an insulator against the CIS substrate 1. For the steps described above, as explained before, the diameter of each of the holes H1 and H2 is set at a value in a range of typically 1 to 5 microns. On the other hand, the depth of each of the holes H1 and H2 is set at a value in a range of typically 3 to 15 microns. In addition, the width of the line CL directly beneath the bottom of the hole H1 is set at a value not smaller than 1 micron. By the same token, the width of the line CC directly beneath the bottom of the hole H2 is set at a value not smaller than 1 micron. On the other hand, the thickness of each of the lines CL and CC is set at a value in a range of 100 nanometers to 1 micron.

It is to be noted that, as described before, the line CL is made of Al (aluminum) whereas the line CC is made of Cu (copper).

Then, at the next step S8, the oxidized film of the bottom of the hole H1 is removed by carrying out an etching process. By the same token, the oxidized film of the bottom of the hole H2 is removed by carrying out an etching process. If a barrier metal layer exists in each of the line CC directly beneath the hole H2 and the line CL directly beneath the hole H1, a condition of a high-select ratio is a condition desirable for this step. As an example, if the barrier metal layer is a layer made of titan nitride (TiN), titan (Ti), tantalum (Ta) or tantalum nitride (TaN) or a stack of layers made of such materials, the etching process is carried under conditions described as follows. At a normal temperature, the pressure is set at a value in a range of 10 to 70 mTorr whereas the source power is set at a value in a range of 700 to 2,000 W. In addition, octafluorocyclobutane ($C_4F_8$), argon (Ar) and oxygen ($O_2$) are used. At that time, the gas flow ratio of the octafluorocyclobutane ($C_4F_8$), the argon (Ar) and the oxygen ($O_2$) is set at 9:1:1. A substrate bias is set at a value in a range of 50 to 300 W and the duration of the etching process is set at a value in a range of approximately 30 seconds to 3 minutes. Under the conditions described above, the select ratio of the underlying etching stopper layer can probably be assured at a value not smaller than 2.

Without regard to whether the barrier metal layer exists, however, even if over-etching is carried out inadvertently, no problem will be raised by the over-etching provided that the thickness of a film remaining on the underlying line CL is at least 100 nanometers. In such a case, as indicated by a range enclosed by a dotted line as shown in FIG. 9, the etching process results in a high-resistance layer OF created on the upper surface of the line CL. Typical examples of the high-resistance layer OF are a nitride film layer and an oxide film layer. As an alternative, by exposing the surface of the metal, a natural oxide film serving as the high-resistance layer OF is created.

Figure 10:
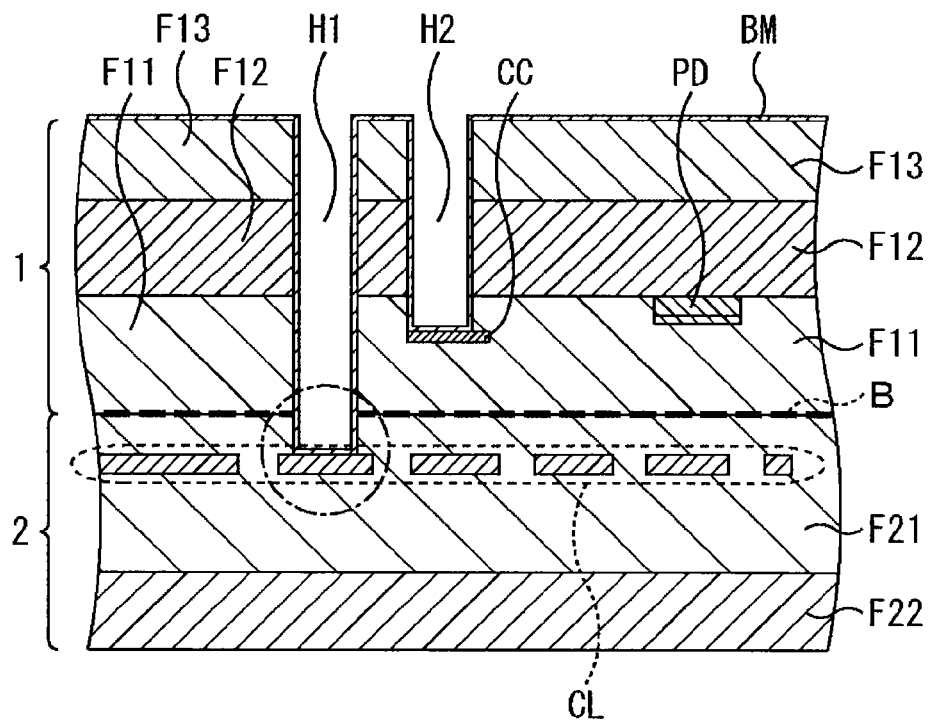
FIG. 10 is an explanatory diagram to be referred to in description of a process of forming a barrier metal film in the hole provided as shown in FIG. 9.

Subsequently, at the next step S9, as shown in FIG. 10, a barrier metal film BM is created on each of the surfaces of the holes H1 and H2 by adoption of the sputtering method. At that time, as indicated by a range enclosed by a dotted line as shown in FIG. 10, the high-resistance layer OF created on the upper surface of the line CL is removed. If the barrier metal layer BM is a layer to be made of titan nitride (TiN), titan (Ti), tantalum (Ta) or tantalum nitride (TaN) or a stack of layers made of such materials, the barrier metal film BM having a thickness in a range of several nanometers to several tens of nanometers is created on the inner wall of each of the holes H1 and H2. It is to be noted that the barrier metal film BM created on each of the bottoms of the holes H1 and H2 may also be removed along with the high-resistance layer OF.

Figure 11:
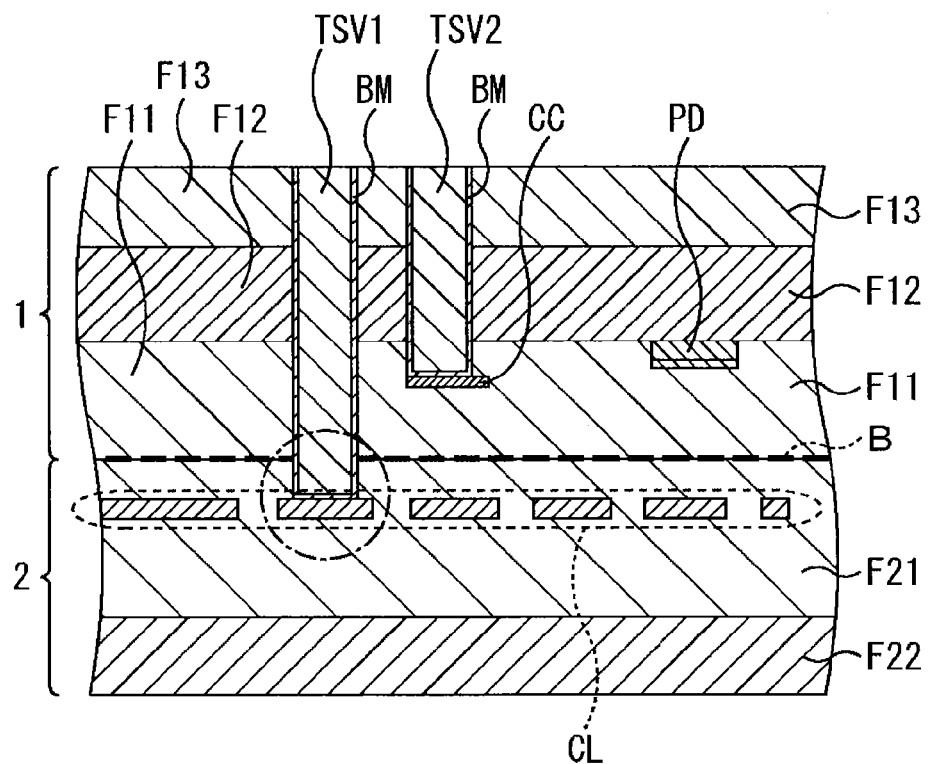
FIG. 11 is an explanatory diagram to be referred to in description of a process of creating a through-silicon via by filling up a hole with copper.

Then, at the next step S10, a copper (Cu) film having a thickness of about several hundreds of nanometers is formed in the holes H1 and H2 by adoption of the sputtering method and the copper CU is embedded by adoption of the plating method making use of copper sulfate in order to create through-silicon vias TSV1 and TSV2 respectively as shown in FIG. 11. Later on, processing adopting the CMP method is carried out on the through-silicon vias TSV1 and TSV2 and a Cu (copper) wiring layer is formed by embedding the wiring layer in order to create a dual damascene wiring structure.

Figure 12:
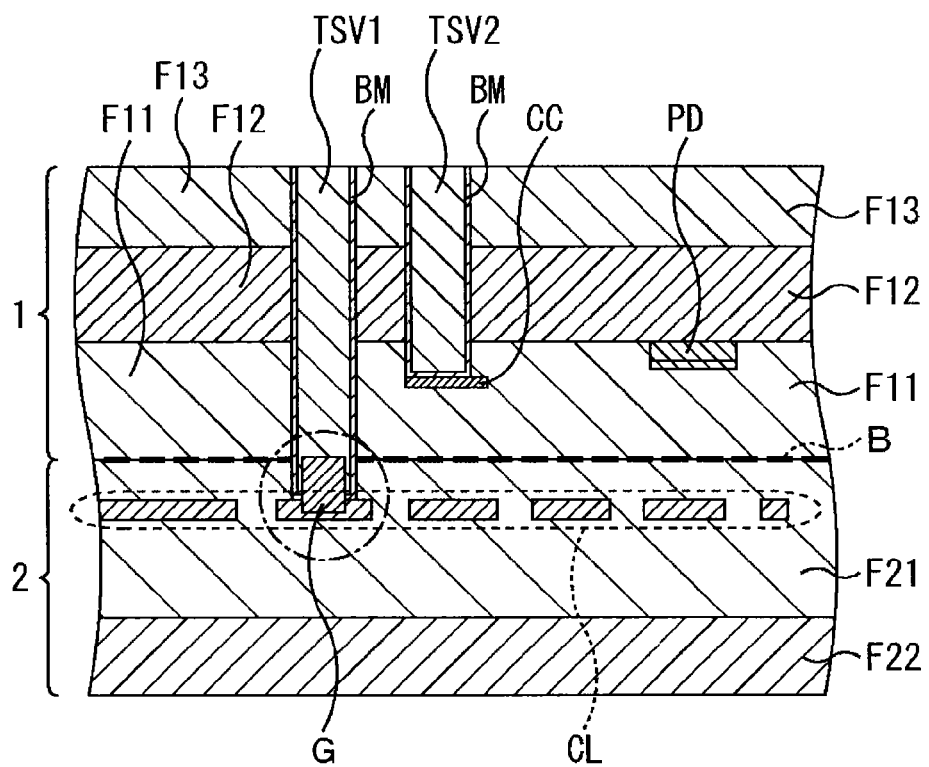
FIG. 12 is an explanatory diagram to be referred to in description of a process of alloying a contact area between a penetrating electrode and a line.

Subsequently, at the next step S11, the whole of the CIS substrate 1 and the logic substrate 2 is heated by carrying out a thermal treatment in order to diffuse aluminum (Al) and copper (Cu) into each other at a location between the through-silicon via TSV1 and the line CL so that a contact area G between the through-silicon via TSV1 and the line CL is alloyed as shown in FIG. 12. For the thermal treatment, the heating temperature is set at about 400° C. whereas the heating environment can be a vacuum environment, the atmosphere, an oxygen environment or a nitrogen environment. The thermal treatment is carried out for about one hour. In the course of the thermal treatment, an alloy component composed of the aluminum AL of the line CL and the copper Cu of the through-silicon via TSV1 is diffused into the inside of the through-silicon via TSV1 made of copper Cu, so that part of the through-silicon via TSV1 made of copper Cu is alloyed.

In addition, at that time, on the line CL made of aluminum Al, a layer of reaction with the Cu (copper) component of the through-silicon via TSV1 made of copper Cu is created as a contact area G which is a CuAl alloy layer.

The contact area G which is the CuAl alloy layer has a range covering an alloyed portion from the bottom surface of the through-silicon via TSV1 to the inside of the through-silicon via TSV1 and a reaction layer (=the CuAl alloy layer) of the line CL made of aluminum Al.

As a result, as indicated by a range enclosed by a dotted line as shown in FIG. 7C, the contact area G between the through-silicon via TSV1 made of copper Cu and the line CL made of aluminum Al is alloyed. In this case, even if over-etching is inadvertently carried out, the depth of the through-silicon via TSV1 is relatively easy to control because the line CL does not retrogress and is not oxidized due to the fact that the contact area G is alloyed. In addition, since the contact area G is alloyed, the resistance decreases and the reliability of the line CL can be improved.

As a result, it is possible to prevent resistance variations from increasing in the contact area in which the edge of the through-silicon via TSV1 is connected to the line CL. Thus, excellent wiring reliability can be obtained and it is possible to manufacture a semiconductor device having a through-silicon via with good controllability and good productivity.

It is to be noted that, if copper Cu and aluminum Al is alloyed in an ordinary line, the copper Cu is diffused in the alloying process, resulting in voids, so that it is feared that the reliability deteriorates. However, the through-silicon via TSV1 made of copper Cu has a large size of about several microns so that the volume occupied by the copper Cu is extremely large. Thus, almost no voids are generated. In addition, since the alloyed section itself has excellent reliability, stress is structurally concentrated so that it is possible to improve the presumably weak EM and SM tolerability properties of the connection member between the edge of the through-silicon via and the surface of the line. Thus, the wiring reliability can be improved.

In addition, the above description has explained a typical configuration of a semiconductor device used as a solid-state imaging device of the rear-surface radiation type. However, the scope of the present technology is by no means limited to the solid-state imaging device. That is to say, the present technology can also be applied to other semiconductor devices. On top of that, the above description has explained a typical case in which copper Cu is used as a material for making the through-silicon vias, aluminum Al is used as a material for making the lines and the contact area is alloyed into a CuAl alloy. However, the through-silicon vias and the lines may be made of any other materials as long as the other materials are materials which can be alloyed with each other. In addition, the above description has explained a typical case adopting a method in accordance with which the materials are alloyed by carrying out a thermal treatment. However, any other method can also be adopted in order to alloy the materials provided that the other method does not have any effect on the structure of the semiconductor device which includes the through-silicon vias and the lines.

On top of that, implementations of the present technology are by no means limited to the embodiment described above. That is to say, the embodiment can be changes in a variety of ways in a range not deviating from essentials of the present technology.

In addition, each of the steps of the flowchart described earlier can be carried out as an operation or divided into a plurality of operations.

On top of that, if a step includes a plurality of processes, the processes included in the step can be carried out as an operation or divided into a plurality of operations.

It is to be noted that the present technology can also be realized into implementations described as follows:

1. A semiconductor device wherein:
    a contact area is alloyed in order to connect an electrode to a line; and
    the electrode and the line share the contact area alloyed in order to electrically connect the electrode and the line to each other in a second semiconductor wafer, which includes logic circuits and lines, and a first semiconductor wafer which includes photoelectric conversion sections and lines.

2. The semiconductor device according to implementation 1 wherein the electrode is a through-silicon via penetrating the first semiconductor wafer stuck to the second semiconductor wafer and the contact area is alloyed in order to electrically connect the through-silicon via and the line to each other in the second semiconductor wafer.

3. The semiconductor device according to implementation 1 or 2 wherein, during a process of sticking the first semiconductor wafer to the second semiconductor wafer and forming a barrier metal film on a penetration hole through which the through-silicon via penetrates the first semiconductor wafer, an aluminum-oxide film on the surface of the line made of aluminum in the second semiconductor wafer is removed and the contact area is alloyed in order to electrically connect the through-silicon via made of copper to the line made of aluminum.

4. The semiconductor device according to any one of implementations 1 to 3 wherein the contact area is alloyed by carrying out a thermal treatment in order to electrically connect the through-silicon via made of copper to the line made of aluminum.

5. A rear-surface radiation solid-state imaging device including the semiconductor device according to any one of implementations 1 to 4.

6. A semiconductor-device manufacturing method including
    a process of alloying a contact area in order to connect an electrode to a line in a semiconductor device whereby, in the process, the contact area shared by the electrode and the line is alloyed in order to electrically connect the electrode and the line to each other in a second semiconductor wafer, which includes logic circuits and lines, and a first semiconductor wafer which includes photoelectric conversion sections and lines.

7. The semiconductor-device manufacturing method according to implementation 6 whereby, in the process, the electrode is created to serve as a through-silicon via penetrating the first semiconductor wafer after the first semiconductor wafer has been stuck to the second semiconductor wafer and the contact area is alloyed in order to electrically connect the through-silicon via and the line to each other in the second semiconductor wafer.

8. The semiconductor-device manufacturing method according to implementation 6 or 7 whereby:
    the process is carried out as a process including
    a first process of sticking the first semiconductor wafer to the second semiconductor wafer, and
    a second process of forming a barrier metal film on a penetration hole through which the through-silicon via penetrates the first semiconductor wafer;
    in the second process, an aluminum-oxide film on the surface of the line made of aluminum in the second semiconductor wafer is removed; and in the second process, the contact area is alloyed in order to electrically connect the through-silicon via made of copper to the line made of aluminum.

9. The semiconductor-device manufacturing method according to any one of implementations 6 to 8 whereby, in the process or the second process, the contact area is alloyed by carrying out a thermal treatment in order to electrically connect the through-silicon via made of copper to the line made of aluminum.

10. A method for manufacturing a solid-state imaging device of a rear-surface radiation type, the method including the semiconductor-device manufacturing method according to any one of implementations 6 to 9.

The present technique contains subject matter related to that disclosed in Japanese Priority Patent Application JP 2011-216930 filed in the Japan Patent Office on Sep. 30, 2011, the entire content of which is hereby incorporated by reference.

What is claimed is:

1. A semiconductor device comprising:
a first semiconductor wafer that includes a first line;
a second semiconductor wafer that includes a second line, a top surface of the second semiconductor wafer attached to a bottom surface of the first semiconductor wafer;
a first electrode that extends to the first line of the first semiconductor wafer;
a second electrode that penetrates through the first semiconductor wafer and extends to the second line of the second semiconductor wafer; and
a barrier film that is positioned between the first and second electrodes and the first semiconductor wafer so that the first and second electrodes do not contact the first semiconductor wafer, wherein
the first line of the first semiconductor wafer is electrically connected with the second line of the second semiconductor wafer through the first and second electrodes,
an end of the second electrode contacts the second line at a second contact area,
the second contact area is an alloy that includes a material of the second electrode and a material of the second line, which is different from a first contact area at which an end of the first electrode contacts the first line, and
the second contact area has a range covering an alloyed portion diffused into the inside of the second electrode and a reaction portion diffused into the inside of the second line from a top surface of the second line.

2. The semiconductor device according to claim 1, wherein
the second electrode is a through-silicon via that penetrates said first semiconductor wafer, and
said second contact area connects said through-silicon via and said second line to each other in said second semiconductor wafer.

3. The semiconductor device according to claim 1, wherein said second electrode penetrates said first semiconductor wafer through a penetration hole in said first semiconductor wafer, and
the barrier film is positioned between an inner surface of the penetration hole in said first semiconductor wafer and the second electrode.

4. The semiconductor device according to claim 1, wherein said second contact area is alloyed by thermal treatment, and
said second contact area electrically connects said second electrode to said second line.

5. A rear-surface radiation solid-state imaging device including the semiconductor device according to claim 1.

6. The semiconductor device according to claim 1, wherein the second electrode comprises copper,
the second line comprises aluminum, and
the second contact area is an alloy of copper and aluminum.

7. A semiconductor device comprising:
a first semiconductor wafer that includes photoelectric sections and a first line;
a second semiconductor wafer that includes logic circuits and a second line, a top surface of the second semiconductor wafer attached to a bottom surface of the first semiconductor wafer;
a first electrode that extends to the first line of the first semiconductor wafer;
a second electrode, that is a through-silicon via, penetrates the first semiconductor wafer and extends to the second line of the second semiconductor wafer; and
a barrier film that is positioned between the first and second electrodes and the first semiconductor wafer so that the first and second electrodes do not contact the first semiconductor wafer, wherein
the first line of the first semiconductor wafer is electrically connected with the second line of the second semiconductor wafer through the first and second electrodes,
an end of the second electrode contacts the second line at a second contact area, the barrier film not positioned between the end of the second electrode and the second line,
the second contact area is an alloy that includes a material of the second electrode and a material of the second line, which is different from a first contact area at which an end of the first electrode contacts the first line, and
the second contact area has a range covering an alloyed portion diffused into the inside of the second electrode and a reaction portion diffused into the inside of the second line from a top surface of the second line.

8. The semiconductor device according to claim 7, wherein the second electrode comprises copper,
the second line comprises aluminum, and
the second contact area is an alloy of copper and aluminum.

9. A semiconductor device comprising:
a first electrode that extends to a first line of a first semiconductor wafer;
a second electrode that penetrates through the first semiconductor wafer and extends to a second line of a second semiconductor wafer, the second semiconductor wafer including the second line;
a barrier film that separates the first and second electrodes and the first semiconductor wafer so that the first and second electrodes do not contact the first semiconductor wafer, wherein
the first line of the first semiconductor wafer is electrically connected with the second line of the second semiconductor wafer through the first and second electrodes,
an end of the second electrode contacts the second line at a second contact area; and
an alloy is positioned at the second contact area between an end of the second electrode and the second line, the second contact area having a range covering an alloyed portion diffused into the inside of the second electrode and a reaction portion diffused into the inside of the second line from a top surface of the second line, the alloy comprising a material of the second electrode and a material of the second line different from a first contact area at which an end of the first electrode contacts the first line, and the alloy connecting the second electrode to the second line.

10. The semiconductor device according to claim 9, wherein
  the second electrode comprises copper,
  the second line comprises aluminum, and
  the second contact area is an alloy of copper and aluminum.

11. The semiconductor device according to claim 1, wherein a diameter of the second electrode is 1 to 5 microns, and a depth of the second electrode is 3 to 15 microns so that the range of the second contract area occupied by the second electrode and the second line is large, resulting in generation of no voids therein.

12. The semiconductor device according to claim 7, wherein a diameter of the second electrode is 1 to 5 microns, and a depth of the second electrode is 3 to 15 microns so that the range of the second contract area occupied by the second electrode and the second line is large, resulting in generation of no voids therein.

13. The semiconductor device according to claim 9, wherein a diameter of the second electrode is 1 to 5 microns, and a depth of the second electrode is 3 to 15 microns so that the range of the second contract area occupied by the second electrode and the second line is large, resulting in generation of no voids therein.

* * * * *